(12) United States Patent
Hwang et al.

(10) Patent No.: US 9,862,173 B2
(45) Date of Patent: Jan. 9, 2018

(54) METHOD FOR FABRICATING WINDOW MEMBER

(71) Applicant: SAMSUNG DISPLAY CO., LTD., Yongin, Gyeonggi-Do (KR)

(72) Inventors: Hyeon-Deuk Hwang, Yongin (KR); Jong-Whan Cho, Yongin (KR); Jong-Deok Park, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 408 days.

(21) Appl. No.: 14/592,109

(22) Filed: Jan. 8, 2015

(65) Prior Publication Data
US 2015/0202853 A1    Jul. 23, 2015

(30) Foreign Application Priority Data

Jan. 22, 2014    (KR) .................. 10-2014-0007506

(51) Int. Cl.
*B29C 65/52*    (2006.01)
*B29C 65/54*    (2006.01)
(Continued)

(52) U.S. Cl.
CPC ............ *B32B 37/12* (2013.01); *B32B 37/182* (2013.01); *B32B 2037/1253* (2013.01);
(Continued)

(58) Field of Classification Search
USPC ............ 156/247, 272.2, 275.5, 275.7, 307.1, 156/307.3
See application file for complete search history.

(56) References Cited

U.S. PATENT DOCUMENTS 6,355,345 B1 * 3/2002 Furuya .............. B32B 17/10018
428/343
6,770,499 B1    8/2004 Chyr
(Continued)

FOREIGN PATENT DOCUMENTS

JP         2008084323 A     4/2008
KR    10-2008-0063103       7/2008
(Continued)

OTHER PUBLICATIONS

Provisional double patenting rejection of claims; USPTO Office Action Made Final dated Nov. 18, 2016 in U.S. Appl. No. 14/592,147.
(Continued)

*Primary Examiner* — Sing P Chan
(74) *Attorney, Agent, or Firm* — Lee & Morse, P.C.

(57) ABSTRACT

A method for fabricating window member may include preparing a transparent polymer film, disposing a light curable adhesive layer on a surface of the transparent polymer film, disposing a transparent substrate on the light curable adhesive layer, the transparent substrate including a transmitting region and a non-transmitting region, and curing the light curable adhesive layer by light irradiation. The light curable adhesive layer may include a transparent adhesive. A storage modulus of the transparent adhesive may be greater than or equal to about $10^3$ Pa to less than about $10^6$ Pa at room temperature before curing, and greater than or equal to about $10^6$ Pa at room temperature after curing.

12 Claims, 6 Drawing Sheets

(51) Int. Cl.
  *B32B 37/12* (2006.01)
  *B32B 38/10* (2006.01)
  *C08J 5/12* (2006.01)
  *C09J 5/00* (2006.01)
  B32B 37/18 (2006.01)
  H01L 51/52 (2006.01)

(52) U.S. Cl.
  CPC . *B32B 2307/412* (2013.01); *B32B 2310/0831* (2013.01); *B32B 2457/20* (2013.01); *H01L 51/5237* (2013.01); *H01L 51/5281* (2013.01)

(56) References Cited

U.S. PATENT DOCUMENTS

| | | |
|---|---|---|
| 2005/0143544 A1 | 6/2005 | Husemann et al. |
| 2010/0277684 A1 | 11/2010 | Fukushima et al. |
| 2013/0223016 A1 | 8/2013 | Kim et al. |
| 2013/0295349 A1 | 11/2013 | Yamasaki et al. |
| 2013/0301272 A1 | 11/2013 | Wang |
| 2014/0211105 A1 | 7/2014 | Cho |
| 2015/0346408 A1* | 12/2015 | Mizutani ............... C08F 220/18 428/41.5 |

FOREIGN PATENT DOCUMENTS

| | | |
|---|---|---|
| KR | 10-2009-0030932 | 3/2009 |
| KR | 10-0948041 B1 | 3/2010 |
| KR | 10-1064644 B1 | 9/2011 |
| WO | WO-2008/082030 A1 | 7/2008 |

OTHER PUBLICATIONS

Provisional double patenting rejection of claims; USPTO Office action dated May 4, 2016, in U.S. Appl. No. 14/592,147.

* cited by examiner

METHOD FOR FABRICATING WINDOW MEMBER

CROSS-REFERENCE TO RELATED APPLICATION

The present application claims priority under 35 U.S.C. §119 to Korean Patent Application No. 10-2014-0007506, filed on Jan. 22, 2014, in the Korean Intellectual Property Office, and entitled: "Method For Fabricating Window Member," which is incorporated by reference herein in its entirety.

BACKGROUND

1. Field

Embodiments relate to methods for fabricating a window member, and preventing a polymer film from being separated from a transparent substrate.

2. Description of the Related Art

With the development of the information society, mobile apparatus such as a cellular phone, a navigation device, a digital camera, an e-book, and a mobile game device are often used. The mobile apparatus has a display panel to display information. The display panel, such as an organic light emitting display panel (OLED panel), a liquid crystal display panel (LCD panel), an electrophoretic display panel (EPD panel), an electrowetting display panel (EWD panel), and so forth used for the mobile apparatus. The mobile apparatus may include the display panel, a housing to receiving the display panel, and a window to protect an exposed surface of the display panel.

SUMMARY

Embodiments are directed to a method for fabricating window member including preparing a transparent polymer film, disposing a light curable adhesive layer on a surface of the transparent polymer film, disposing a transparent substrate on the light curable adhesive layer, the transparent substrate including a transmitting region and a non-transmitting region, and curing the light curable adhesive layer by light irradiation. The light curable adhesive layer may include a transparent adhesive. A storage modulus of the transparent adhesive may be greater than or equal to about $10^3$ Pa to less than about $10^6$ Pa at room temperature before curing, and greater than or equal to about $10^6$ Pa at room temperature after curing. The storage modulus of the transparent adhesive may be greater than or equal to about $10^7$ Pa at room temperature after curing.

The method may further include disposing a light curable material layer on another surface of the transparent polymer film. A plurality of micro patterns may be disposed on the light curable material layer in the non-transmitting region. The light curable material layer may be cured by light irradiation. A deposition layer including a plurality of layers having different refraction indices may be disposed on the light curable material layer. The light curable material layer may be removed in the transmitting region. A light blocking layer may be disposed on the deposition layer in the non-transmitting region. Disposing the deposition layer may include disposing a first layer transmitting light on the light curable material layer, and disposing a second layer having a refraction index less than a refraction index of the first layer on the first layer.

The method may further include laminating a light-transmittable release film on the light curable adhesive layer before disposing the deposition layer, curing edge of the light curable adhesive layer, forming an outline of the window member, and removing the light-transmittable release film. The transparent adhesive may include an acrylic copolymer composed of solution polymerizable acrylic compounds and reactive initiators, and UV curable compounds. The solution polymerizable acrylic compounds may include at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, and isodecyl acrylate. The solution polymerizable acrylic compounds may include from about 30 percent by weight to about 60 percent by weight of butyl acrylate, from about 30 percent by weight to about 60 percent by weight of 2-ethylhexyl acrylate, and from about 0.1 percent by weight to about 40 percent by weight of acrylic acid based on the total weight of the solution polymerizable acrylic compounds. The reactive initiators may include at least one of benzoyl peroxide, acetyl peroxide, dilauryl peroxide, hydrogen peroxide, potassium persulfonate, and 2,2'-azobis(isobutyronitrile).

The UV curable compounds may include at least one of caprolactone acrylate, 1,6-hexanediol diacrylate, trimethylolpropane triacrylate, pentaerythritol triacrylate, lauryl acrylate, urethane acrylate, epoxy acrylate, polyester acrylate, and silicon acrylate. The UV curable compounds may include from about 5 percent by weight to about 50 percent by weight of trimethylolpropane triacrylate, from about 5 percent by weight to about 50 percent by weight of multi-functional urethane acrylate, and from about 5 percent by weight to about 50 percent by weight of 1,6-hexanediol diacrylate base on the total weight of UV curable compounds. The transparent adhesive may include photoinitiators. The acrylic copolymer and the UV curable compounds may be from about 70:30 to about 95.5:0.5 by weight ratio in the transparent adhesive.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The present disclosure may be modified variably and may have various embodiments, particular examples of which will be illustrated in drawings and described in detail. However, it is to be understood that the present disclosure is not limited to a specific disclosed form, but includes all modifications, equivalents, and substitutions without departing from the scope and spirit of the present disclosure.

In describing drawings, like numbers refer to like elements. In the accompanying drawings, dimensions of structures may be exaggerated to clarify the present disclosure. While terms such as "first," "second," and the like may be used to describe various components, such components are not limited to the above terms. The above terms are used only to distinguish one component from another. For instance, a first component may be referred to as a second component without departing from the scope of rights of the present disclosure, and likewise a second component may be referred to as a first component. As used herein, the singular forms "a," "an," and "the" include the plural forms as well, unless the context clearly indicates otherwise.

Terms such as "including," "having," and the like indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added. When an element such as a layer, film, region, or substrate is referred to as being "on" another element, it can be directly on the other element or intervening elements may also be present. When an element such as a layer, film, region, or substrate is referred to as being "beneath" another element, it can be directly on the other element or intervening elements may also be present.

Figure 1:
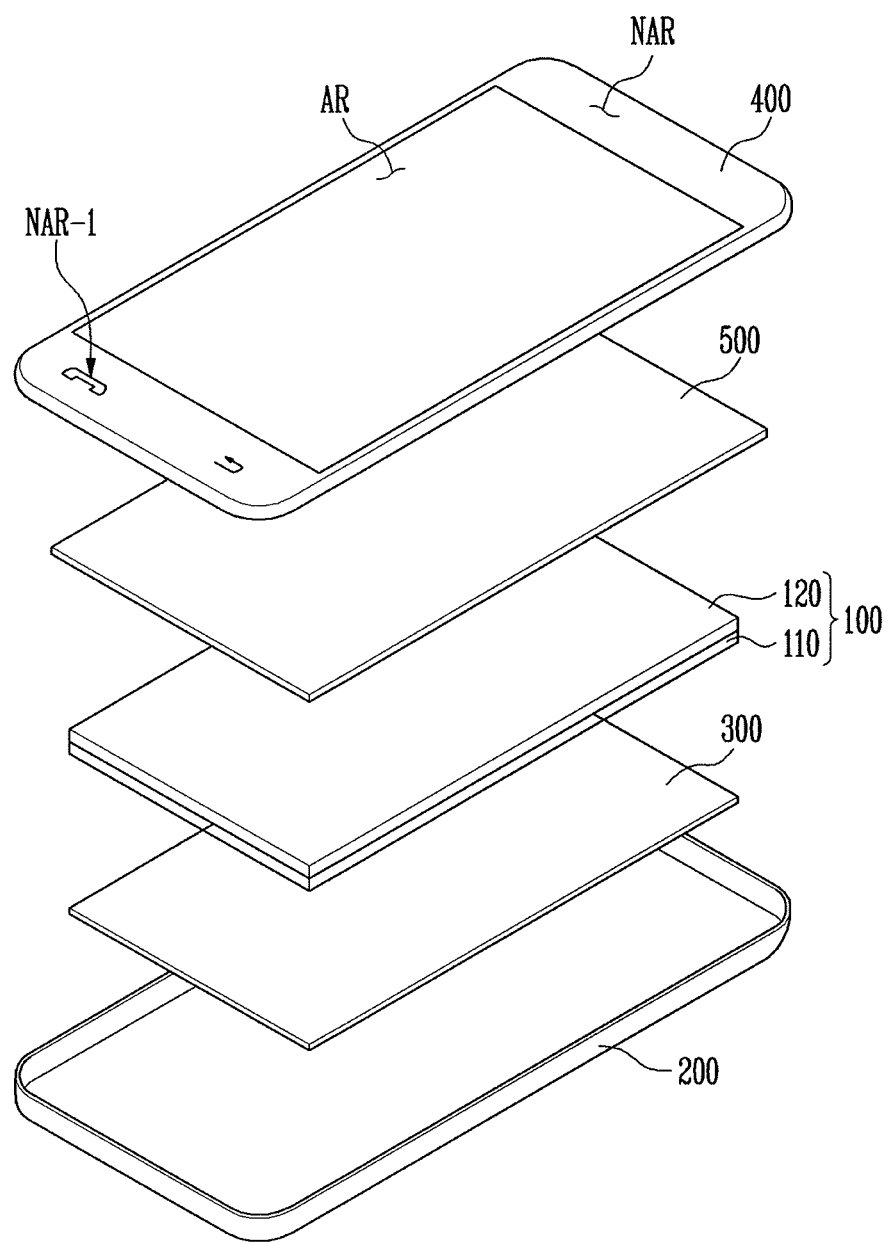
FIG. 1 illustrates an exploded perspective view of a mobile apparatus having a window member.
Figure 2:
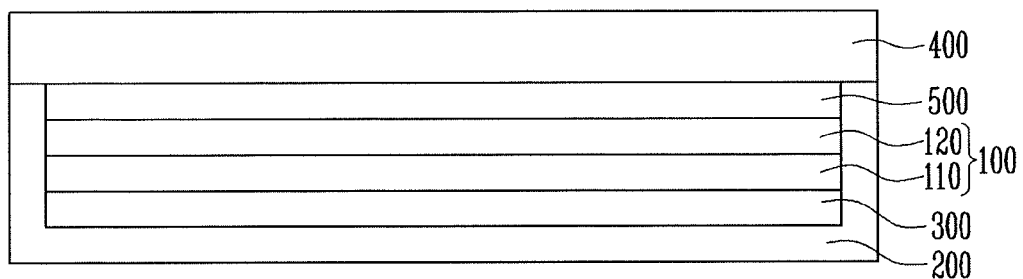
FIG. 2 illustrates a cross-sectional view of the mobile apparatus in FIG. 1.

FIG. 1 illustrates an exploded perspective view of a mobile apparatus having a window member, and FIG. 2 illustrates a cross-sectional view of the mobile apparatus in FIG. 1. Referring to FIGS. 1 and 2, a mobile apparatus may include a display panel 100, a housing 200 for receiving the display panel 100, an impact absorption sheet 300 between the display panel 100 and the housing 200, a window member 400 over the display panel 100, and an adhesive sheet 500 between the display panel 100 and the window member 400.

The display panel 100 may display an image. For example, the display panel 100 may include self light-emitting display panels such as an organic light emitting display (OLED) panel, a plasma display panel (PDP), and the like. The display panel 100 may include non-emissive display panels such as a liquid crystal display (LCD) panel, an electrophoretic display (EPD) panel, an electrowetting display (EWD) panel, and the like. When a non-emissive display panel is used as the display panel 100, for example, a display device may include a backlight unit that supplies light to the display panel 100. As an example, the display panel 100 is described as an organic light emitting display (OLED) panel.

The display panel 100 may include a first substrate 110 having an organic light emitting device as a display device, and a second substrate 120 facing the first substrate 110. The first substrate 110 may include a thin film transistor substrate having an insulation substrate and at least one of thin film transistor on the insulation substrate, and the organic light emitting device electrically connected to the thin film transistor. The first substrate 110 may have a driver 115 disposed in a side of the thin film transistor substrate and driving the organic light emitting device. The driver 115 may be, for example, a chip-on-glass (COG) type driving device.

The organic light emitting device may be disposed on the thin film transistor substrate. The organic light emitting device may include a first electrode electrically connected to the thin film transistor, an organic layer disposed on the first electrode, and a second electrode disposed on the organic layer. One of the first electrode and the second electrode may be an anode, and the other of the first electrode and the second electrode may be a cathode. At least one of the first electrode and the second electrode may be a transparent electrode. For example, the first electrode may include a transparent conductive oxide, e.g., indium tin oxide (ITO), indium zinc oxide (IZO), aluminum zinc oxide (AZO), gallium-doped zinc oxide (GZO), zinc tin oxide (ZTO), gallium tin oxide (GTO), fluorine-doped tin oxide (FTO), or the like, or a combination thereof. The second electrode may reflect light. The second electrode may include, for example, a material having a work function less than that of the first electrode. For example, the second electrode may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or an alloy thereof.

The organic layer may include at least an emitting layer (EML) and may generally have a multi-layered thin film structure. For example, the organic layer may include the emitting layer (EML) and/or at least one selected from a hole injection layer (HIL) for injecting a hole, a hole transport layer (HTL) having a superior transportation characteristic and for blocking migration of unbound electrons at the EML to increase a chance of hole-electron rebinding (the EML emitting light by rebinding the injected electrons to holes), a hole blocking layer (HBL) for suppressing migration of unbound holes at the EML, an electron transport layer (ETL) for smoothly transporting the electrons to the EML, and an electron injection layer (EIL) for injecting the electrons. The color of light generated in the EML may be, for example, red, green, blue, and/or white. Any suitable color or combination of colors may be generated. For example, the color of light generated in the EML may be magenta, cyan, and/or yellow.

The second substrate 120 may isolate the display device from the environment. The second substrate 120 may be coupled on the first substrate 110 through a sealant. For example, the second substrate 120 may be a transparent insulating substrate. When a transparent insulating layer seals the organic light emitting device, for example, the second substrate 120 may be omitted.

An optional polarization member (not shown) may be between the display panel 100 and the window member 400. The polarization member may prevent the image display performance of the display panel 100 from being lowered due to reflection of a light incident from the exterior (hereinafter, referred to as an external light). For example, the polarization member may include a polarization film having a polarization axis in a specific direction and a retardation film having a phase difference of about ¼λ. The polarization member may prevent the image display performance of the display panel 100 from being lowered due to reflection of the external light by converting the external light into a circular polarization. The polarization member may be omitted.

The housing 200 may receive the display panel 100. In FIG. 1, the housing is formed of a member having a space in which the display panel 100 is received. The housing 200 may be formed of one member or two or more members. As an example, the housing 200 is described as formed of one member. In addition to the display panel 100, the housing 200 may further receive a printed circuit board on which a plurality of active elements and/or a plurality of passive elements may be mounted. The housing 200 can receive a power supply such as a battery according to a type of display apparatus.

The impact absorption sheet 300 may be disposed between the display panel 100 and the housing 200, and may absorb an external impact forced to the display panel 100. The impact absorption sheet 300 may prevent an external impact from directly impacting the display panel 100. The impact absorption sheet 300 may include an impact absorption film capable of absorbing an external impact and an adhesive material coated on at least one of both surfaces of the impact absorption film. For example, the adhesive material may be coated on one surface of the impact absorption film such that the impact absorption sheet 300 may be fixed at the display panel 100 or the housing 200. The impact absorption film may be formed of a rubber foam or a lamination of the rubber foam, and may have a thickness of about 300 μm.

The window member 400 may be in a direction where an image may be output from the display panel 100. The window member 400 may be united with the housing 200 to form an outer surface of the display apparatus together with the housing 200. The window member 400 may include a transmission region AR for display of an image generated from the display panel 100 and a non-transmission region NAR adjacent to at least a part of the transmission region AR. The non-transmission region NAR is generally not used to display an image. The non-transmission region NAR may surround the transmission region AR. At least a part of the non-transmission region NAR may be defined as an input icon region NAR-I. The input icon region NAR-I may be activated when, for example, the display apparatus operates at a specific mode.

The adhesive sheet 500 may adhere the display panel 100 and the window member 400. The adhesive sheet 500 may be transparent to reduce the possibility of and/or prevent the brightness of an image output from the display panel 100 from being reduced due to the adhesive sheet 500. For example, the adhesive sheet 500 may include a transparent polymer resin that is adhesive and is hardened by light or heat.

Figure 3:
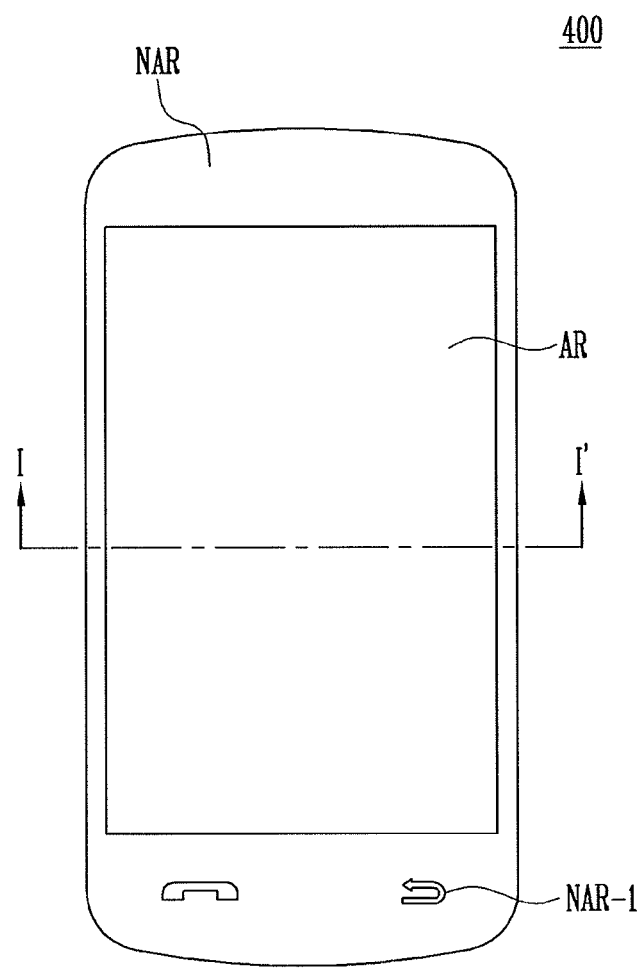
FIG. 3 illustrates a plan view of the window member in FIG. 1.
Figure 4:
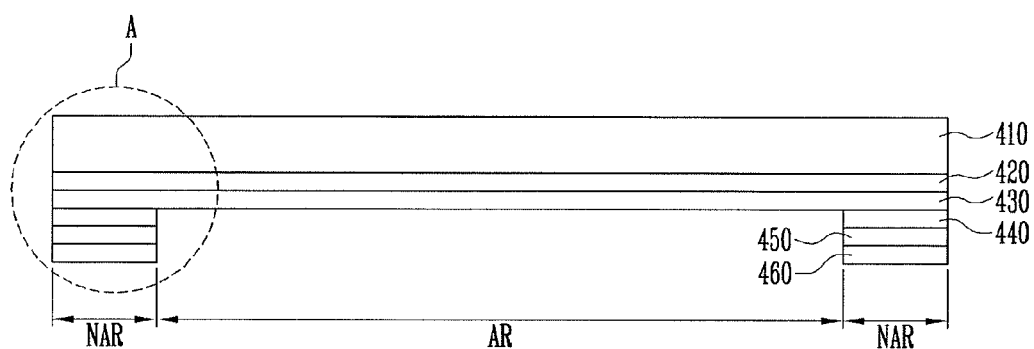
FIG. 4 illustrates a cross-sectional view taken along line I-I' of FIG. 3.
Figure 5:
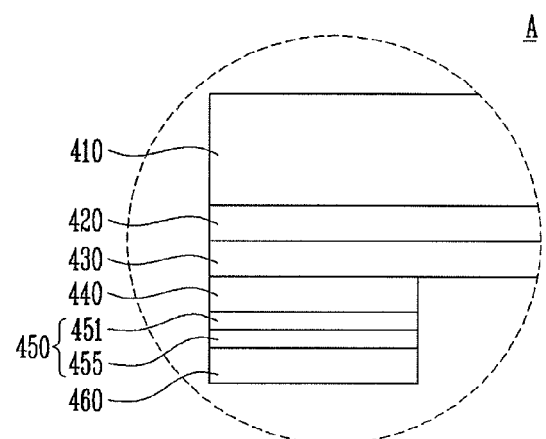
FIG. 5 illustrates an enlarged view of a region "A" in FIG. 4.
Figure 6:
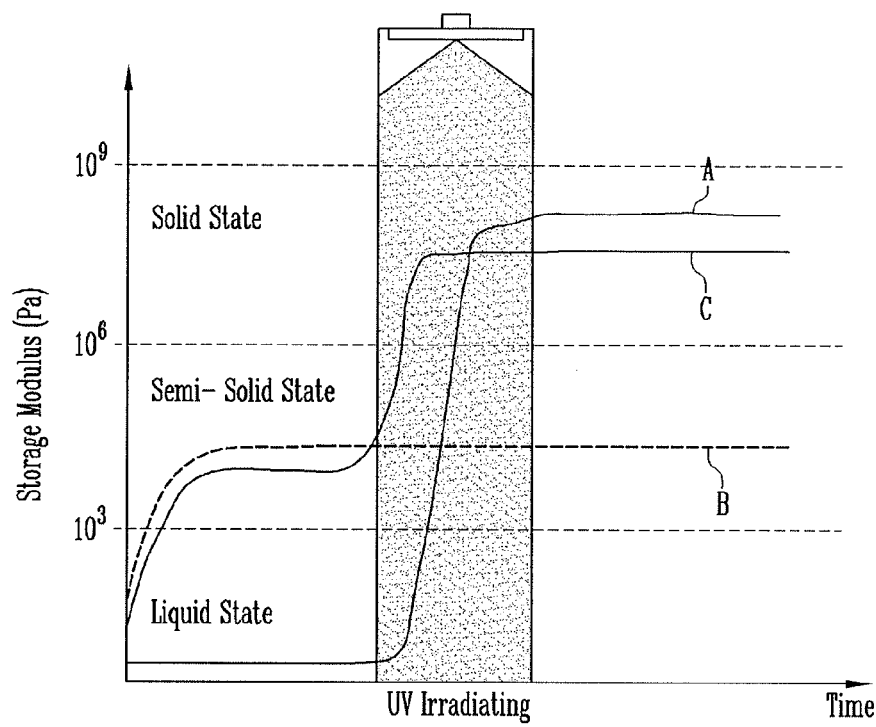
FIG. 6 illustrates a graph of storage modulus of a transparent adhesive in FIG. 3

FIG. 3 illustrates a plan view of the window member in FIG. 1, FIG. 4 illustrates a cross-sectional view taken along line I-I' of FIG. 3, FIG. 5 illustrates an enlarged view of a region "A" in FIG. 4, and FIG. 6 illustrates a graph of storage modulus of a transparent adhesive in FIG. 3. Referring to FIGS. 3 to 6, a window member 400 may include the transmission region AR light-transmittable and the non-transmission region NAR adjacent to at least a part of the transmission region AR. The non-transmission region NAR may surround the transmission region AR. At least a part of the non-transmission region NAR may be defined as an input icon region NAR-I.

The window member 400 may include a transparent substrate 410, a light curable adhesive layer 420, a polymer film 430, a pattern printed layer 440, a deposition layer 450, and a light blocking layer 460. The transparent substrate 410 may have, for example, a square shape having rounded corners. The transparent substrate 410 may be a reinforced plastic substrate or reinforced glass substrate. The light curable adhesive layer 420 may be between the transparent substrate 410 and the polymer film 430. The light curable adhesive layer 420 may include a transparent adhesive.

As shown FIG. 6, the transparent adhesive may be semi-solid state at room temperature before curing. A storage modulus of the transparent adhesive in semi-solid state may be greater than or equal to about $10^3$ Pa to less than about $10^6$ Pa at room temperature before curing. The transparent adhesive may be cured to solid state by irradiating UV (C). The storage modulus of the transparent adhesive in solid state may be, for example, greater than or equal to about $10^6$ Pa at room temperature after curing. The storage modulus of the transparent adhesive in solid state may be, for example, greater than or equal to about $10^7$ Pa at room temperature after curing. The transparent adhesive may be different from a pressure sensitive adhesive PSA (B) in semi-solid state after irradiating UV, or an UV curable adhesive (A). The UV curable adhesive may be liquid phase and have a storage modulus, for example, equal to or less than about $10^3$ Pa at room temperature before curing. The UV curable adhesive may be solid phase and have a storage modulus, for example, greater than or equal to about $10^6$ Pa at room temperature after curing.

The transparent adhesive may include an acrylic copolymer and an UV curable compounds. The acrylic copolymer may be composed of one or more solution polymerizable acrylic compounds and reactive initiators. The solution polymerizable acrylic compounds may be compounds having adhesion by solution polymerization. The solution polymerizable acrylic compounds may include, for example, at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate. For example, the solution polymerizable acrylic compounds may include butyl acrylate, 2-ethylhexyl acrylate, and acrylic acid. The solution polymerizable acrylic compounds may include, for example, from about 30 percent by weight to about 60 percent by weight of butyl acrylate, from about 30 percent by weight to about 60 percent by weight of 2-ethylhexyl acrylate, and from about 0.1 percent by weight to about 40 percent by weight of acrylic acid based on the total weight of solution polymerizable acrylic compounds.

The reactive initiators may be thermal initiators. The thermal initiator may be decomposed by heat to produce a radical, and the synthesis reaction may be initiated by the radical. For example, the thermal initiator may include at least one of benzoyl peroxide, acetyl peroxide, dilauryl peroxide, hydrogen peroxide, and potassium persulfonate, 2,2'-azobis(isobutyronitrile). The transparent adhesive may include, for example, from about 100 part by weight of the solution polymerizable acrylic compounds and from about 0.1 part by weight to about 15 part by weight of the reactive initiators based on the total weight of the transparent adhesive. The acrylic copolymer may have, for example, from about 200,000 to about 1,500,000 weight-average molecular weight.

The UV curable compounds may include one or more compounds capable of curing by UV. The UV curable compounds may include at least one of caprolactone acrylate, 1,6-hexanediol diacrylate, trimethylolpropane triacrylate, pentaerythritol triacrylate, lauryl acrylate, urethane acrylate, epoxy acrylate, polyester acrylate, silicon acrylate. For example, the UV curable compounds may include trimethylolpropane triacrylate, multi-functional urethane acrylate, and 1,6-hexanediol diacrylate. The UV curable compounds may include, for example, from about 5 percent by weight to about 50 percent by weight of trimethylolpropane triacrylate, from about 5 percent by weight to about 50 percent by weight of multi-functional urethane acrylate, and from about 5 percent by weight to about 50 percent by weight of 1,6-hexanediol diacrylate based on the total weight of the UV curable compounds. The acrylic copolymer and the UV curable compounds may be from about 70:30 to about 95.5:0.5 by weight ratio in the transparent adhesive. The transparent adhesive may have enough adhesion and be effectively cured by UV. The transparent adhesive may further include photoinitiators. The photoinitiators may be decomposed by light to produce a radical, and the synthesis reaction may be initiated by radical. The photoinitiators may be, for example, acetophenone group compounds. The transparent adhesive may include, for example, about 100 part by weight of the UV curable compounds and about 0.1 part by weight to about 5 part by weight of the photoinitiators base on the total weight of the transparent adhesive.

The polymer film 430 may be disposed on a surface of the light curable adhesive layer 420 in a direction toward the display panel 100. The copolymer film 430 may include light-transmittable material. For example, the copolymer film 430 may include at least one of polymethylmethacrylate (PMMA), polycarbonate (PC), polyethylene terephthalate (PET). For example, the copolymer film 430 may include light-transmittable materials after curing.

In the non-transmission region NAR, the pattern printed layer 440 may be on a surface of the polymer film 430 in a direction toward the display panel 100. The pattern printed layer 440 may include a light curable material such as UV curable resin. A plurality of micro patterns may be on a surface of the pattern printed layer 440 in a direction toward the display panel 100. The micro patterns may provide aesthetic elements to a mobile apparatus.

The deposition layer 450 may be on a surface of the pattern printed layer 440 in a direction toward the display panel 100. The deposition layer 450 may have a plurality of layers having different refraction indices. For example, the deposition layer 450 may be on a surface of a direction where an image is output from the display panel 100 in the light curable adhesive layer 420. The deposition layer 450 may have a light-transmittable first layer 451, and a second layer 455 having a refraction index different from a refraction index of the first layer 451. The refraction index of the first layer 451 may be, for example, greater than the refraction index of the second layer 455. For example, the refraction indices of the first and second layers 451 and 455 may be from about 1.3 to about 2.4, and a difference between the refraction indices of the first and second layers 451 and 455 may be greater than or equal to about 0.1. The first layer 451 and the second layer 455 may include one of $SiO_2$ and $TiO_2$. For example, the first layer 451 may include $TiO_2$ and the second layer 455 may include $SiO_2$. A refraction index of the $TiO_2$ may be more than a refraction index of the $SiO_2$.

The deposition layer 450 may reflect light having predetermined wavelength between the first layer 451 and the second layer 455. The deposition layer 450 may determine a color of the window member 400 in the non-transmitting region NAR. As an example, the deposition layer 450 is described as having a first layer 451 and a second layer 455. Alternatively, the deposition layer 450 may include a plurality of units having the first layer 451 and the second layer 455.

The light blocking layer 460 may be disposed another surface of the deposition layer 450. The light blocking layer 460 may include materials capable of blocking light, and preventing that light from being transmitted. For example, the light blocking layer 460 may include, for example, metal having low reflectance, for example, Cr and/or Mo. The light blocking layer 460 may include an opaque inorganic materials such as $CrO_x$ and/or $MoO_x$. The light blocking layer 460 may include an opaque organic materials, for example, having a white resin and/or a black resin.

Figure 7:
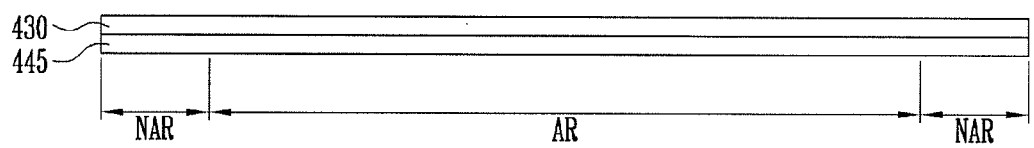
FIG. 7, FIG. 8, and FIG. 10 to FIG. 13 illustrate cross-sectional views of stages of a method for fabricating the window member in FIG. 3.
Figure 8:
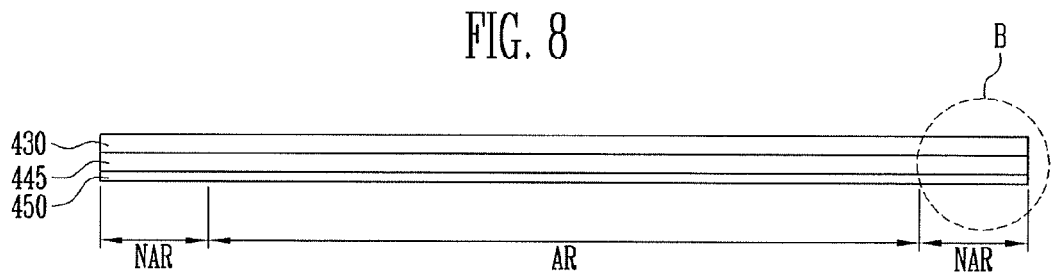
Figure 9:
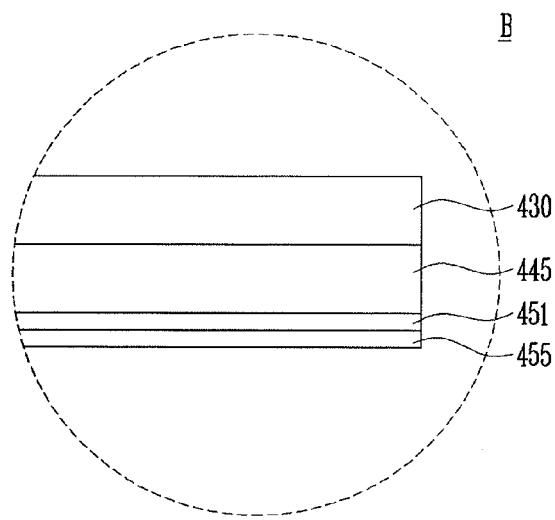
FIG. 9 illustrates an enlarged view of a region "B" in FIG. 8.

FIG. 7, FIG. 8, and FIG. 10 to FIG. 13 illustrate cross-sectional views of stages of a method for fabricating the window member in FIG. 3, and FIG. 9 illustrates an enlarged view of a region "B" in FIG. 8. Referring to FIG. 7, a polymer film 430 may be prepared. The polymer film 430 may include, for example, one of polymethylmethacrylate (PMMA), polycarbonate (PC), polyethylene terephthalate (PET). The polymer film 430 may have a transmission region AR light-transmittable and a non-transmission region NAR adjacent to at least a part of the transmission region AR.

After preparing the polymer film 430, a light curable material layer 445 may be disposed on a surface of the polymer film 430 by coating light curable materials. The light curable material layer 445 may include an UV curable resin. A storage modulus of a UV curable resin is shown in A of FIG. 6. The UV curable adhesive may be in a liquid phase and have a storage modulus, for example, equal to or less than about $10^3$ Pa at room temperature before curing. The UV curable adhesive may be in a solid phase and have a storage modulus, for example, greater than or equal to about $10^6$ Pa at room temperature after curing.

After disposing the light curable material layer 445, a plurality of micro patterns may be disposed on an exposed surface of the light curable material layer 445 in the non-transmission region NAR. The micro patterns may be a hairline or a hologram. The micro patterns may be formed, for example, by a mold having micro patterns. After disposing the micro patterns, the light curable material layer 445 may be cured by irradiating UV. The light curable material layer 445 may be changed to a solid state, and a storage modulus of the light curable material layer 445 in solid state may be greater than or equal to about $10^6$ Pa at room temperature after curing.

Referring to FIGS. 8 and 9, after curing the light curable material layer 445, a deposition layer 450 may be disposed on an exposed surface of the light curable material layer 445. The deposition layer 450 may have a plurality of layers having different refraction indices. For instance, the deposition layer 450 may have a light-transmittable first layer 451, and a second layer 455 having a refraction index different from a refraction index of the first layer 451.

The deposition layer 450 may be disposed as follows. The first layer 451 may be disposed on the exposed surface of the light curable material layer 445. Then, the second layer 455 may be disposed on the first layer 451. The refraction index of the first layer 451 may be, for example, more than the refraction index of the second layer 455. For example, the refraction indices of the first and second layers 451 and 455 may be from about 1.3 to about 2.4, and a difference between the refraction indices of the first and second layers 451 and 455 may be, for example, greater than or equal to about 0.1. The deposition layer 450 may reflect light having a predetermined wavelength between the first layer 451 and the second layer 455 due to the difference between the refraction indices of the first and second layers 451.

Figure 10:
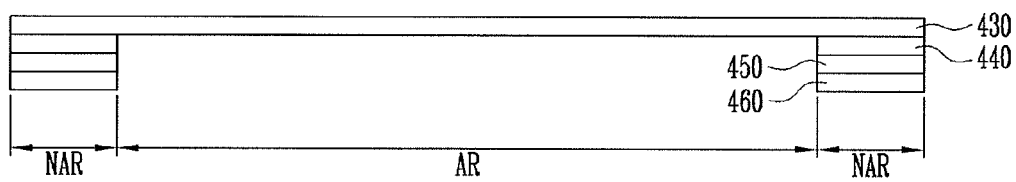

Referring to FIG. 10, after disposing the deposition layer 450, the light curable material layer 445 and the deposition layer 450 may be etched in the transmitting region AR. The light curable material layer 445 and the deposition layer 450 may be, for example, retained in non-transmission region NAR. The light curable material layer 445 may be a pattern printed layer 440, and the deposition layer 450 may determine a color of the window member 400 in the non-transmitting region NAR.

After etching the deposition layer 450, a light blocking layer 460 may be disposed on an exposed surface of the deposition layer 450. The light blocking layer 460 may include materials capable of blocking light, and preventing that light from being transmitted. For example, the light blocking layer 460 may include metal having low reflectance such as Cr and/or Mo. The light blocking layer 460 may include an opaque inorganic materials such as $CrO_x$ and/or $MoO_x$. The light blocking layer 460 may include an opaque organic materials having such as white resin and/or black resin. As an example, the light blocking layer 460 is described as being disposed after etching the light curable material layer 445 and the deposition layer 450. Alternatively, the light curable material layer 445, the deposition layer 450, and the light blocking layer 460 may be etched in the transmitting region AR after the deposition layer 450 and the light blocking layer 460 are disposed on the exposed surface of the light curable material layer 445.

Figure 11:
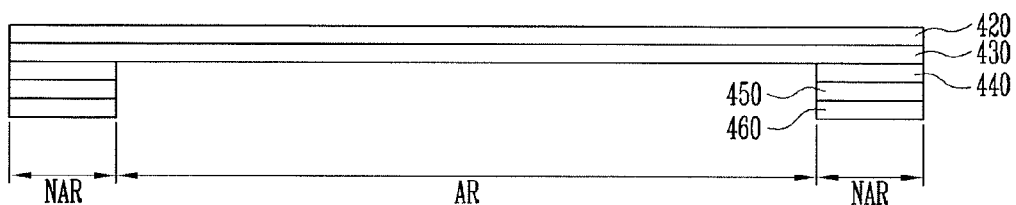

Referring to FIG. 11, after disposing the light blocking layer 460, a light curable adhesive layer 420 may be disposed on the other surface of the polymer film 430. The light curable adhesive layer 420 may include a transparent adhesive. The transparent adhesive may be in a semi-solid state. A storage modulus of the transparent adhesive in semi-solid state may be, for example, greater than or equal to about $10^3$ Pa to less than about $10^6$ Pa at room temperature before curing.

Figure 12:
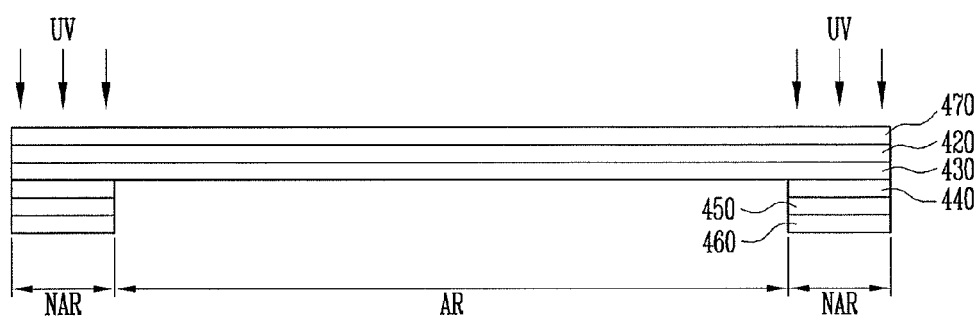

Referring to FIG. 12, after disposing the light curable adhesive layer 420, a release film 470 may be laminated on the light curable adhesive layer 420. The release film 470 may prevent contamination of the light curable adhesive layer 420. The release film 470 may include materials light-transmittable. After laminating the release film 470, an edge of the light curable adhesive layer 420 may be cured by irradiating UV in a direction that the release film 470 is disposed. After curing the edge of the light curable adhesive layer 420, forming the outline of a window member may proceed. The forming of the outline of a window member may be performed, for example, by one or more of press working, numerical control NC cutting, computerized numerical control CNC, and laser cutting.

Figure 13:
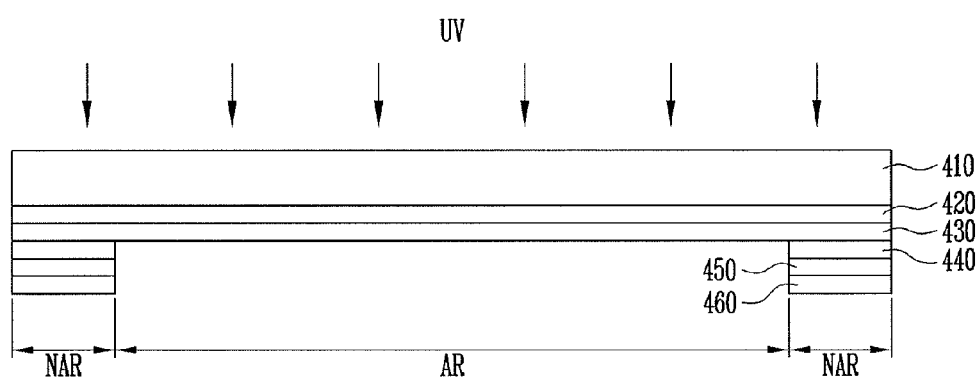

Referring to FIG. 13, after forming outline of the window member, the release film 470 may be removed. Then, a transparent substrate 410 may be disposed on the light curable adhesive layer 420. After disposing the transparent substrate 410, the light curable adhesive layer 420 may be cured by irradiating a light such as UV. The transparent substrate 410 may be tightly coupled with the polymer film 430 by curing the light curable adhesive layer 420. A storage modulus of the light curable adhesive in solid state may be greater than or equal to about $10^6$ Pa at room temperature after curing.

A method for fabricating window member may improve coupling strength between the transparent substrate 410 and the polymer film 430 by curing the light curable adhesive layer 420. The light curable adhesive layer 420 in a semi-solid state may easily couple the transparent substrate 410 with the polymer film 430, and the light curable adhesive layer 420 in a solid state may tightly couple the transparent substrate 410 with the polymer film 430.

By way of summation and review, a window may have a window glass and a polymer film. The window glass and the polymer film may be coupled by a transparent adhesive. However, the transparent adhesive may leak from a side of the window. In addition, when adhesion of the transparent adhesive is not sufficient, for example, the polymer film may be separated from a transparent substrate due to impact. As described herein, a method for window member preventing a polymer film from being separated from a transparent substrate is provided. For example, the light curable adhesive layer 420 may prevent the polymer film 430 from being separated from a transparent substrate 410.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for fabricating window member, the method comprising:
   preparing a transparent polymer film, the transparent polymer film including a transmitting region and a non-transmitting region;
   disposing a light curable material layer on another surface of the transparent polymer film;
   disposing a plurality of micro patterns on the light curable material layer in the non-transmitting region;
   curing the light curable material layer by light irradiation;
   disposing a deposition layer including a plurality of layers having different refraction indices on the light curable material layer;
   removing the light curable material layer in the transmitting region;
   disposing a light blocking layer on the deposition layer in the non-transmitting region;
   disposing a light curable adhesive layer on a surface of the transparent polymer film;
   disposing a transparent substrate on the light curable adhesive layer; and
   curing the light curable adhesive layer by light irradiation,
   wherein the light curable adhesive layer includes a transparent adhesive, a storage modulus of the transparent adhesive is greater than or equal to about $10^3$ Pa to less than about $10^6$ Pa at room temperature before curing, and greater than or equal to about $10^6$ Pa at room temperature after curing.

2. The method as claimed in claim 1, wherein the storage modulus of the transparent adhesive is greater than or equal to about $10^7$ Pa at room temperature after curing.

3. The method as claimed in claim 1, wherein disposing the deposition layer includes:
   disposing a first layer transmitting light on the light curable material layer; and
   disposing a second layer having a refraction index less than a refraction index of the first layer on the first layer.

4. The method as claimed in claim 3, further comprising:
   laminating a light-transmittable release film on the light curable adhesive layer before disposing the deposition layer;
   curing edge of the light curable adhesive layer;
   forming an outline of the window member; and
   removing the light-transmittable release film.

5. The method as claimed in claim 1, wherein the transparent adhesive includes an acrylic copolymer composed of solution polymerizable acrylic compounds and reactive initiators, and UV curable compounds.

6. The method as claimed in claim 5, wherein the solution polymerizable acrylic compounds include at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, and isodecyl acrylate.

7. The method as claimed in claim 6, wherein the solution polymerizable acrylic compounds include from about 30 percent by weight to about 60 percent by weight of butyl acrylate, from about 30 percent by weight to about 60 percent by weight of 2-ethylhexyl acrylate, and from about 0.1 percent by weight to about 40 percent by weight of acrylic acid based on the total weight of the solution polymerizable acrylic compounds.

8. The method as claimed in claim 5, wherein the reactive initiators include at least one of benzoyl peroxide, acetyl peroxide, dilauryl peroxide, hydrogen peroxide, potassium persulfonate, and 2,2'-azobis(isobutyronitrile).

9. The method as claimed in claim 5, wherein the UV curable compounds include at least one of caprolactone acrylate, 1,6-hexanediol diacrylate, trimethylolpropane triacrylate, pentaerythritol triacrylate, lauryl acrylate, urethane acrylate, epoxy acrylate, polyester acrylate, and silicon acrylate.

10. The method as claimed in claim 9, wherein the UV curable compounds include from about 5 percent by weight to about 50 percent by weight of trimethylolpropane triacrylate, from about 5 percent by weight to about 50 percent by weight of multi-functional urethane acrylate, and from about 5 percent by weight to about 50 percent by weight of 1,6-hexanediol diacrylate base on the total weight of UV curable compounds.

11. The method as claimed in claim 5, wherein the transparent adhesive further includes photoinitiators.

12. The method as claimed in claim 5, wherein the acrylic copolymer and the UV curable compounds are from about 70:30 to about 95.5:0.5 by weight ratio in the transparent adhesive.

* * * * *